(12) United States Patent
Barton

(10) Patent No.: US 7,514,941 B2
(45) Date of Patent: Apr. 7, 2009

(54) METHOD AND APPARATUS FOR PREDICTING THE RELIABILITY OF ELECTRONIC SYSTEMS

(75) Inventor: Paul H. Barton, Midlothian, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 11/376,942

(22) Filed: Mar. 15, 2006

(65) Prior Publication Data

US 2007/0216427 A1 Sep. 20, 2007

(51) Int. Cl.
*G01R 31/26* (2006.01)
*G01R 27/00* (2006.01)

(52) U.S. Cl. .................................. 324/719; 324/765
(58) Field of Classification Search ................ 324/719, 324/760
See application file for complete search history.

(56) References Cited

U.S. PATENT DOCUMENTS

| | | | | |
|---|---|---|---|---|
| 4,076,971 A * | 2/1978 | Mukaemachi et al. | .......... | 379/30 |
| 5,195,046 A | 3/1993 | Gerardi et al. | .............. | 364/506 |
| 5,392,219 A * | 2/1995 | Birch et al. | ................. | 702/117 |
| 5,600,254 A * | 2/1997 | Berberich | ................... | 324/711 |
| 6,134,971 A * | 10/2000 | Misra et al. | .................... | 73/777 |
| 6,765,401 B2 * | 7/2004 | Hamada | ...................... | 324/760 |
| 6,822,473 B1 * | 11/2004 | Hau-Riege et al. | .......... | 324/766 |
| 2005/0049835 A1 * | 3/2005 | Mayer et al. | ................ | 702/184 |
| 2005/0107963 A1 * | 5/2005 | Campbell | ..................... | 702/42 |
| 2005/0120807 A1 | 6/2005 | Wingett et al. | ......... | 73/862.041 |
| 2005/0246124 A1 * | 11/2005 | Tomer et al. | ................ | 702/117 |
| 2005/0268734 A1 * | 12/2005 | Watkins, Jr. et al. | .......... | 73/866 |
| 2006/0066335 A1 * | 3/2006 | Kang et al. | ................. | 324/760 |

FOREIGN PATENT DOCUMENTS

JP 07286910 A * 10/1995

OTHER PUBLICATIONS

S.J. Ham and S.B. Lee, "Experimental Study for Reliability of Electronic Packaging under Vibration;" Experimental Mechanics; pp. 339-344.

Thomas Baumann et al.; "Underfilled PBGA Packages and Their Board Level Cycling and Vibration Performance;" SMTA International 2002; Donald Stephens Convention Center Rosemont, Illinois; 5 pages.

European Search Report; Reference: JL38109P.EPP; Application No./ Patent No.: EP 07 25 0898.9-2216; 8 pages.

Tong Yan Tee, et al.; "Advanced Experimental and Simulation Techniques for Analysis of Dynamic Responses During Drop Impact;" IEEE; pp. 1088-1094.

(Continued)

*Primary Examiner*—Timothy J Dole
*Assistant Examiner*—John Zhu
(74) *Attorney, Agent, or Firm*—Baker Botts L.L.P.

(57) ABSTRACT

An apparatus for predicting the reliability of an electronic system is provided. The apparatus includes at least one component, a stress sensor operable to measure stress of the at least one component, a resistance sensor operable to measure an electrical resistance of the at least one component, and an electronic control system coupled to the stress sensor and resistance sensor operable to predict the reliability of the electronic system using the stress and electrical resistance of the at least one component.

23 Claims, 2 Drawing Sheets

OTHER PUBLICATIONS

Shingo Hirano, et al.; "Conductive Coating on Structural Ceramics for Strain Detection Utilizing Electrical Measurements;" Journal of the European Ceramic Society; pp. 2087-2095.

Lizzul, et al.; "Fatigue Investigation of Lap Shear Solder Joints Using Resistance Spectroscopy;" Proceedings of the Electronic Components and Technology Conference, Washington, IEEE; vol. Conf. 44, XP010126236; pp. 458-464.

Tze yang Hin et al.; "Development of a Dynamic Test Board for FCBGA Solder Joints Using Resistance Spectroscopy;"IEEE; XP010687255; pp. 256-262.

* cited by examiner

METHOD AND APPARATUS FOR PREDICTING THE RELIABILITY OF ELECTRONIC SYSTEMS

GOVERNMENT FUNDING

This invention was made with Government support via Contract DAAE07-03-9-F001 awarded by the United States Army. The Government has certain rights in this invention.

TECHNICAL FIELD OF THE INVENTION

This invention relates in general to testing and, more particularly, to predicting the reliability of electronic systems.

BACKGROUND OF THE INVENTION

The failure of electronic systems is a common problem for systems under repeated stress and vibration. Electronic systems are often contained in packages that include thousands of solder bumps, traces, and vias that are used to connect various components. Under extreme temperatures and mechanical stress, solder joints, traces, and vias can crack. Often called microcracking, they can lead to the complete failure of an electronic system.

Electronic system failure due to stress has historically been unpredictable. Current methods for detecting such failures involve using historical data of the life cycle of specific electronic components and systems as a guide to how long implemented systems will operate before a failure. This method, based only on usage time, is generally unreliable due to the variation of an individual electronic system's environmental and physical conditions over a period of time before a failure is experienced. The current method often fails to predict the failure of an electronic system or forces a premature replacement of such systems.

SUMMARY OF THE INVENTION

An apparatus for predicting the reliability of an electronic system is provided. The apparatus includes at least one component, a stress sensor operable to measure stress of the at least one component, a resistance sensor operable to measure an electrical resistance of the at least one component, and an electronic control system coupled to the stress sensor and resistance sensor operable to predict the reliability of the electronic system using the stress and electrical resistance of the at least one component.

Various embodiments of the present invention may benefit from numerous advantages. It should be noted that one or more embodiments may benefit from some, none, or all of the advantages discussed below.

One advantage of certain embodiments is that the failure of an electronic system under stress can be predicted with better accuracy than existing methods. Another advantage of certain embodiments is that multiple electronic components can be continually monitored in real time across large scale complex systems to predict potential failures. Another advantage of certain embodiments is that the accuracy of failure predictions increases over time.

Other advantages will be readily apparent to one having ordinary skill in the art from the following figures, descriptions, and claims.

BRIEF DESCRIPTION OF THE DRAWINGS

For a more complete understanding of the present invention and for further features and advantages, reference is now made to the following description, taken in conjunction with the accompanying drawings, in which.

DETAILED DESCRIPTION OF THE DRAWINGS

Figure 1:
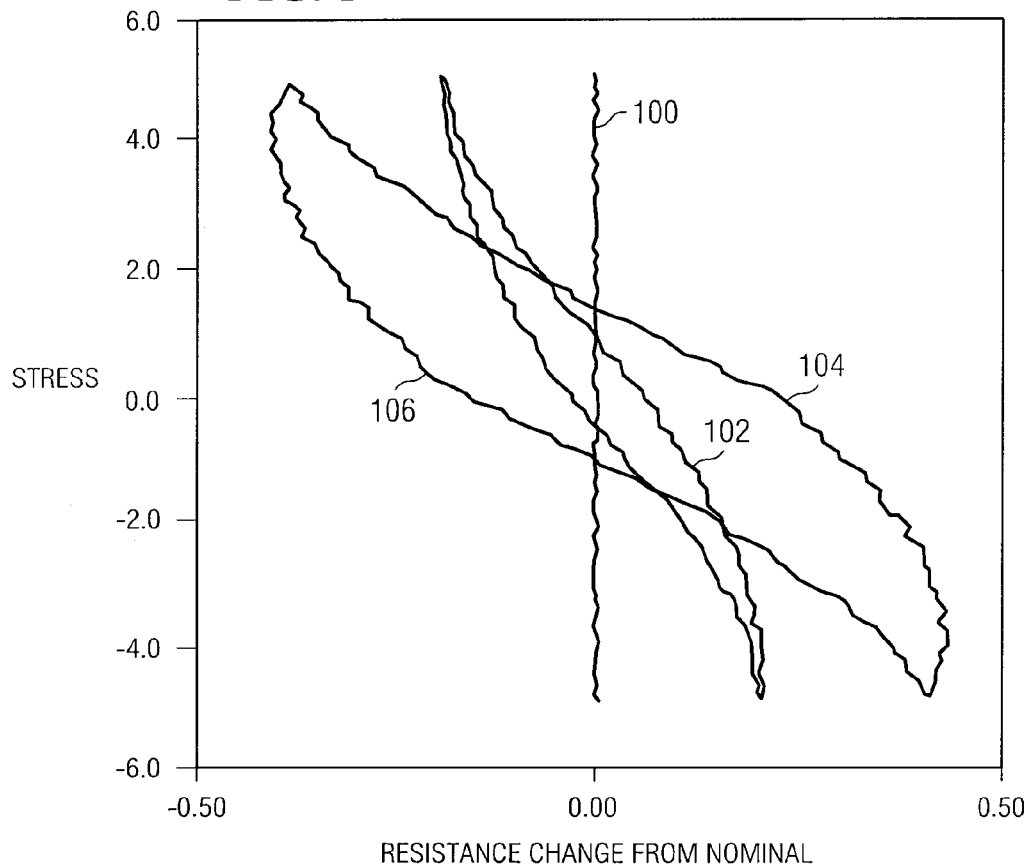
FIG. 1 illustrates a graph describing the failure characteristics of electronic systems at difference resistivity changes and stresses.
Figure 3:
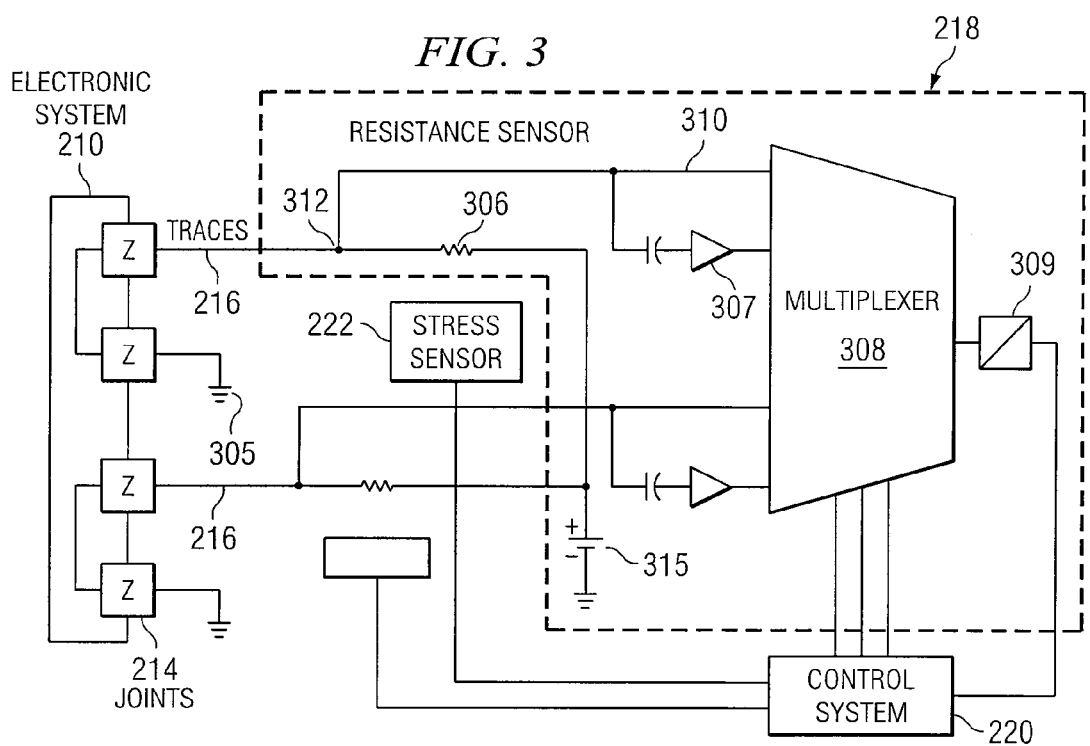
FIG. 3 illustrates an apparatus for predicting the reliability of an electronic system in accordance with an embodiment of the present invention.
Figure 2:
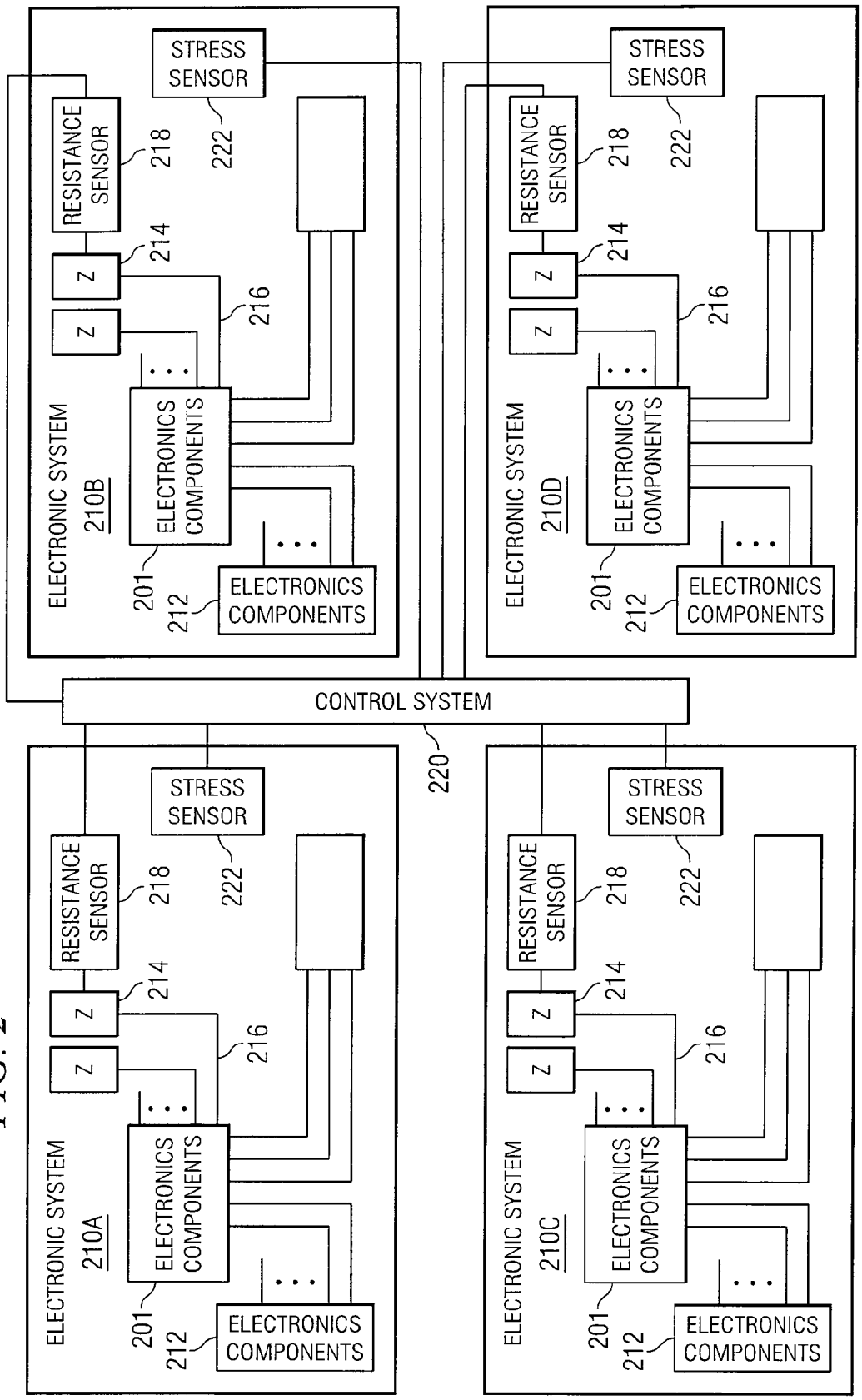
FIG. 2 illustrates an apparatus for predicting the reliability of an electronic system in accordance with an embodiment of the present invention.

Example embodiments of the present invention and their advantages are best understood by referring now to FIGS. 1 through 3 of the drawings, in which like numerals refer to like parts.

According to some embodiments of the present invention, representative connections consisting of solder joints, solder bumps, traces, vias, connectors, pins, wires, integrated circuit structures, and any other connection type known in the art and combinations thereof (collectively called "components") can be used to measure the amount of micro-cracking developed by an electronic system as a result of temperature excursions and vibration. This is done in certain embodiments by measuring the change in electrical resistance of the components and the stress they are experiencing over a time period. The time period can span fractions of a second or can last as long as hours.

In reference to FIG. 1, the figure shows a hysteresis curves 100, 102, 104, and 106 with the normalized changes in electrical resistance of a component of an electronic system shown by the horizontal axis and the stress level experienced by the component at the same time shown by the vertical axis. In new components, resistance variations will likely be very small even at high stress points. However, as the components age and experience increased stress, the components will experience sudden jumps in micro-cracks, eventually leading to an open circuit and a failure of the electronic system. This is shown in FIG. 1, where the vertical line 100 shows the hysteresis with a new circuit. Curve 102 has a small amount of hysteresis indicating a small amount of microcracking and curves 104 and 106 indicate a large amount of microcracking, indicating that a failure is imminent. The more micro-cracks a system has, the more likely it is to fail. Although the traces, solder joints, wires, and other elements comprising the components are generally conductors, they do contain some resistance. The teachings of the invention recognize that the near-zero resistance increases when there are microcracks, caused, for example, by stress, temperature variances, or vibration. The resistance also increases when the component with microcracks is flexed by vibration stress, which causes the microcracks to widen. Changes in the size of micro-cracks lead to changes in the electrical resistance of components. As a result, measuring changes in the resistivity of components can provide an estimate of the degree of micro-cracks suffered by the components. The ratio of resistance variation to the amount of vibration is an indication of the amount of microcracking, which in turn is a predictor of reliability or failure rate of the system.

In some embodiments of the present invention, resistance sensors and stress sensors may be used to monitor components of an electronic system to predict failures. Resistance sensors, such as sensors using the rate of discharge of capacitor connected to the component or sensors comprising a resistor and voltage source of known values, well known in the art may be used to measure a component's resistivity. Stress sensors, including accelerometers and strain gauges, that are well known in the art may used to measure the stress and vibration at the components whose resistance is measured. The measurements can be monitored by information handling systems well known in the art, such as computers. Not all components of an electronic system need be monitored. Components can be chosen to be monitored that are representative of thousands of other components used in the normal functioning of the electronic system.

FIG. 2 illustrates a fault prediction system for an electronic system in accordance with an embodiment of the present invention. Four electronic systems 210A, 210B, 210C, and 210D are shown in FIG. 2, although the present invention can be expanded to include additional systems or reduced to include fewer systems. The systems 210 can be individual printed circuit boards, line cards, ASICs, or other equivalent systems known in the art. Each system can include electronic components 201 and 212 that are interconnected. Each system can also include solder joints 214, traces 216, vias, connectors, pins, wires, integrated circuit structures, and any other connection type known in the art and combinations thereof. In accordance with one embodiment of the present invention, a resistance sensor 218 can be connected to the unused traces 216 and unused solder joints 214. In the embodiment of FIG. 2, the resistance sensor combination of 218 can measure the resistance across both the traces 216 and solder joints 214 in series. Unused vias, connectors, pins, wires, integrated circuit structures, and any other connection type known in the art and combinations thereof can also be measured. The resistance sensor combination of 218 is connected to an information processing and control system 220. Resistance sensor combination of 218 is operable to measure the resistance of either the solder joints 214, traces 216, or both over milliseconds or over several seconds. The resistance measurement can be sent to control system 220. In addition, a stress sensor 222 is located at or near the trace 216 or solder joint 214. The stress sensor 222 is connected to the control system 220. The stress sensor is operable to measure the stress of traces 216 and solder joints 214 at the same times and over the same intervals as resistance sensor combination of 218 is operable to measure their resistance. According to FIG. 2, systems 210 each contain unused traces 216 and solder joints 214 whose resistance is measured by resistance sensor combination of 218 and each resistance sensor 218 is connected to control system 220. Systems 210 can be located on the same or different printed circuit boards, ASICs, line cards, or other equivalent electronic structures known in the art. The sensors on them may be used to predict the reliability or failure of a single system, if they comprise a single system, or separate systems if they comprise separate systems.

Information processing and control system 220 may itself be a computer system, a line card of a computer system, an ASIC, an FPGA, or any other information processing and control system or logic implementation known in the art. System 220 is operable to process the resistance data from resistance sensor combination of 218 and the stress data from stress sensor 222. In some embodiments, system 220 determines the ratio of resistance variation to the amount of vibration using data from the resistance sensor combination of 218 and stress sensor 222 for each system 210, or combines the data from all four systems and determines the ratio collectively. This ratio provides an indication of the amount of microcracking endured by the system or systems, which in turn is a predictor of the reliability or the failure rate of the system. In addition, control system 220 is operable to generate the hysteresis graph shown in FIG. 1. In some embodiments, the hysteresis graph can be used by a human operator to determine the reliability or predict the failure of system or systems 210. The control system 220 is also operable to compute the relative magnitudes of the stress effects to the change in resistivity of the measured traces 216, solder joints 214, vias, connectors, pins, wires, integrated circuit structures, and any other connection type known in the art and combinations thereof. This relative magnitude, when compared to historical or test data of failures of equivalent systems, can also be used to predict the reliability or failure of the system or systems. In some embodiments, the control system 220 is also operable to compare the relative magnitude to historical or test data to predict reliability and failures. Finally, control system 220 is operable to build failure and reliability data for electronic systems 210 using the resistance and stress data gathered from sensors 218 and 222 by logging the resistance changes and stress levels experienced by the systems at various time intervals during and before a failure.

FIG. 3 illustrates a fault prediction system for electronic devices in accordance with a particular embodiment of the present invention. A package 210 of an electronic system is shown. Package 210 can be any of systems 210A, 210B, 210C, or 210D shown in FIG. 2, or all them combined together. The package can be a ball grid array ("BGA"), a pin grid array ("PGA"), or any other equivalent package known in the art. The package can contain solder joints, solder bumps, connectors, and pins 214, or traces, vias, wires, or integrated circuit structures 216, and combinations thereof. The illustrated joints 214 and traces 216 can be representative of the thousands found in an electronic system. According to one embodiment of the present invention, one or more unused solder joints 214 can be connected in series with one or more traces 216 of an electronic system package 210 and connected to ground 305 at one end. The connections of the present invention can be made during or after the fabrication of the electronic system, i.e., the printed circuit board or integrated circuit. At the other end, the series of solder joints and traces can be connected to a known reference voltage source 315 through a reference resistor 306 with a known resistance, to an amplifier 307, and to a multiplexer 308. The amplifier can also be connected to multiplexer 308. The multiplexer 308 outputs a selected signal to an analog to digital converter 309 ("A/D"). The multiplexer 308 and A/D 309 can be connected to an information processing and control system 220 ("control system"), i.e., a computer, an ASIC, a line card, or any other equivalent system known in the art. Accelerometers or other stress measurement devices 222 can be located at or near each representative component and can be connected to the control system 220. This configuration is shown twice in FIG. 3 can be repeated multiple of times within an electronic system and across electronic systems, with multiple connections 310 into a single or to multiple multiplexers 308.

In reference to FIG. 3, according to some embodiments, the resistance across components consisting of solder joints 214 and traces 216 is measured by measuring the voltage at point 312. This voltage measurement can be directly connected to multiplexer 308 and/or can also first be amplified by amplifier 307 and then connected the multiplexer 308. The control system 220 can direct the multiplexer to pass the amplified or unamplified signal to A/D converter 309 where the voltage is converted to a digital signal. The control system 220 can determine the resistance of the component using the voltage measurement at point 312, the predetermined voltage of the voltage source 315, and the predetermined resistance of the reference resistor 306. The voltage at 312 may be changing less than a millivolt during vibration when the circuit is new. However, the voltage may increase to several millivolts when the circuit is approaching the end of its life. The amplifier 307 can be used to boost the voltage signal at 312 to allow it to be more easily measured. The resistivity can be determined by multiplying the voltage at 312 by the value of reference resistor 306. This product is divided by the value of the reference voltage 315 and the result is the resistivity of the component. The resistance of the chosen component can also be measured in numerous other ways known in art. To determine the change in the resistance of the component, these steps are repeated to determine the resistance of the component at a later time. The difference between the two resistance values taken at different times provides the change in resistance of the component over the time period. At the same time as the resistance of the components is measured, the stress experienced by the components can also measured using accelerometers 222. As previously discussed, the change in resistance of the component, combined with information regarding the stress experienced by the component, can then be compared to, for example, historic test data from highly accelerated life tests ("HALT") or information gathered by the control system 220 itself of similar electronic systems and components to predict a timeframe or the likelihood of system failure. As discussed, the control system 220 is operable to predict system 210's reliability and failure using the resistance and stress data in the manner above.

Although an embodiment of the invention and its advantages are described in detail, a person skilled in the art could make various alterations, additions, and omissions without departing from the spirit and scope of the present invention as defined by the appended claims.

What is claimed is:

1. An apparatus for predicting the reliability of an electronic system comprising at least one component, the apparatus comprising:
    an acceleration sensor operable to measure acceleration of the at least one component;
    a resistance sensor operable to measure an electrical resistance of the at least one component; and
    an electronic control system coupled to the acceleration sensor and resistance sensor to predict the reliability of the electronic system using the acceleration and electrical resistance of the at least one component.

2. The apparatus of claim 1, wherein the resistance sensor further comprises:
    a reference resistor coupled to the at least component; and
    a reference voltage source coupled to the reference resistor.

3. The apparatus of claim 2, wherein the resistance sensor further comprises:
    an amplifier coupled to the at least one component;
    a multiplexer coupled to the amplifier; and
    an analog to digital converter coupled to the multiplexer wherein the analog to digital converter is coupled to the electronic control system.

4. The apparatus of claim 1, wherein the acceleration sensor comprises a strain gauge.

5. The apparatus of claim 1, wherein the electronic control system comprises at least one member of the set consisting of a computer, an ASIC, an FPGA, and other logic implementation.

6. The apparatus of claim 1, wherein the at least one component comprises at least one member of the set consisting of: solder joints, solder bumps, traces, vias, connectors, pins, wires, and integrated circuit structures.

7. The apparatus of claim 1, wherein the at least one component is representative of other components comprising the electronic system.

8. The apparatus of claim 1, wherein the at least one component comprises at least one member of the set consisting of: unused solder joints, unused solder bumps, unused traces, unused vias, unused connectors, unused pins, unused wires, and unused integrated circuit structures.

9. The apparatus of claim 1, wherein the acceleration sensor comprises an accelerometer.

10. The apparatus of claim 1, wherein the electronic control system is further operable to store the resistance measurements and acceleration measurements.

11. A method for predicting the reliability of an electronic system under stress, the method comprising:
    measuring the electrical resistance of a component of the electronic system over a time period;
    determining changes in electrical resistance of the component over the time period;
    measuring the acceleration of the component over the time period; and
    predicting a time period that the component will remain operational before failing by comparing the change in resistance of the component and the acceleration of the component over the time period to predetermined reliability data associated with the change in resistance and acceleration.

12. The method of claim 11 wherein the component is representative of a set of components comprising the electronic system.

13. The method of claim 11 wherein the component comprises at least one member of the set consisting of: solder joints, solder bumps, traces, vias, connectors, pins, wires, and integrated circuit structures.

14. The method of claim 11 wherein the electric resistance of a component is measured using a voltage at the component.

15. A computerized method for predicting the reliability of a first electronic system comprising:
    measuring a resistance change of a component of a representative second electronic system at time intervals until the second electronic system fails;
    measuring an acceleration of the component of the second electronic system at the time intervals;
    storing the resistance change measurements, acceleration measurements, and time intervals in an information storage system; and
    predicting a time period that the first electronic system will remain operational before failing by:
        measuring the resistance change of a component of the first electronic system at the time intervals;
        measuring the acceleration of the component of the first electronic system at the time intervals; and
        comparing the change in resistance of the component and the acceleration of the component of the first electronic system to the stored resistance change measurements and acceleration measurements of the representative second electronic system using a computer.

16. The method of claim 15 wherein the component of the second electronic system is representative of a set of components comprising the electronic system.

17. The method of claim 15 wherein the component of the second electronic system comprises at least one member of the set consisting of: solder joints, solder bumps, traces, vias, connectors, pins, wires, and integrated circuit structures.

18. The method of claim 15 wherein the electric resistance of a component is measured using a voltage at the component.

19. The method of claim 15, wherein the component of the first electronic system is representative of components comprising the electronic system.

20. The method of claim 15, wherein the electrical resistance of the component is measured using the rate of discharge of a capacitor connected to the component.

21. The method of claim 15, wherein the acceleration of the component is measured by a strain gauge.

22. The method of claim 15, wherein the acceleration of the component is measured by an accelerometer.

23. The method of claim 15 wherein the component of the first electronic system comprises at least one member of the set consisting of: solder joints, solder bumps, traces, vias, connectors, pins, wires, and integrated circuit structures.

* * * * *